(12) United States Patent
Nelson et al.

(10) Patent No.: US 6,882,173 B1
(45) Date of Patent: Apr. 19, 2005

(54) METHOD AND APPARATUS DETECTING SHORTED TURNS IN AN ELECTRIC GENERATOR

(75) Inventors: Robert John Nelson, Orlando, FL (US); Aleksandar Prole, Winter Springs, FL (US); Stephen W. Cates, Oviedo, FL (US); Abraham Nieves, Orlando, FL (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 31 days.

(21) Appl. No.: 10/672,770

(22) Filed: Sep. 26, 2003

(51) Int. Cl.$^7$ .......................... G01R 31/06; G01R 31/34
(52) U.S. Cl. ........................ 324/772; 324/546
(58) Field of Search ................ 324/158.1, 500, 324/537, 545–547, 772; 318/138, 254, 434, 490, 696; 322/89; 340/648, 650

(56) References Cited

U.S. PATENT DOCUMENTS

| | | | | | |
|---|---|---|---|---|---|
| 1,432,003 | A | * | 10/1922 | West | 324/546 |
| 3,932,811 | A | * | 1/1976 | Branch | 324/772 |
| 4,442,393 | A | * | 4/1984 | Abbondanti | 318/802 |

* cited by examiner

Primary Examiner—David Zarneke
Assistant Examiner—Russell M. Kobert

(57) ABSTRACT

Methods and systems consistent with the present invention provide improved online detection of one or more shorts in rotor turns (18) of a field winding (22) of an electric generator. An initial reference inductance $L_{REF}$ is determined by an impedance-measuring circuit (50). A subsequent inductance L is determined by the impedance measuring circuit (50). A data processing system (54) compares $L_{REF}$ to L to determine whether they differ by a predetermined amount. If $L_{REF}$ and L differ by the predetermined amount, an alarm is provided to operators to indicate the presence of one or more shorted rotor turns.

17 Claims, 3 Drawing Sheets

METHOD AND APPARATUS DETECTING SHORTED TURNS IN AN ELECTRIC GENERATOR

FIELD OF THE INVENTION

The present invention relates generally to the monitoring of electric machinery, and more particularly to methods and apparatuses for detecting shorted turns in an electric generator.

BACKGROUND

Electric generators, such as those used in the power generation industry, essentially comprise a rotor and a stator. The rotor is wound with conductors to form a field winding. The stator is wound with conductors to form a stator winding. The field winding is supplied with an excitation current in order to create a magnetic field on the rotor. When the rotor spins inside the stator, electric power is induced in the stator winding.

The rotor of an electric generator is generally machined from a solid steel forging. Slots are provided along the length of the rotor for inserting the conductors that make up the field winding. FIG. 1 illustrates a slot 10 of a typical synchronous generator rotor 12. The slot 10 is filled with multiple copper conductors 14. Each copper conductor is separated from adjacent copper conductors by an insulation layer 16. The conductors 14 extend down the axial length of the rotor 12. A pair of electrically connected conductors 14 is referred to as a rotor turn 18.

When an electric generator is first manufactured, each rotor turn 18 is electrically insulated along the axial length of the rotor from adjacent rotor turns by the insulation layer 16. Over time, various factors related to the normal operation of the generator may cause damage to the insulation layer 16. Damage to the insulation layer 16 may permit adjacent rotor turns to come into electrical contact. This situation is referred to as a rotor turn short. Rotor turn shorts significantly reduce the overall inductance of the field winding of a rotor and impair the efficiency and output capability of a generator. When sufficient rotor turn shorts occur, a rotor must generally be rewound to repair the shorts.

The conventional approach to detecting shorted rotor turns in an operating generator involves the use of a flux probe. A flux probe is basically a coil in which a voltage is induced by a varying magnetic flux. The flux probe is used to measure the magnetic field associated with each rotor pole by placing the probe inside the generator air gap and then observing and comparing the flux associated with each rotor pole. The main problems with flux probes are that the data acquired by flux probes are sensitive to generator load and the interpretation of the data is relatively subjective. Flux probe systems are also quite expensive, generally costing in excess of $25,000 per unit.

SUMMARY OF THE INVENTION

With the foregoing in mind, methods and systems consistent with the present invention enable improved online detection of rotor turn shorts in an operating generator. An exemplary embodiment of the present invention utilizes an AC component of the excitation power provided to a field winding to calculate a reference inductance $L_{REF}$. Over time, new inductance values are calculated. The new inductance values are compared to $L_{REF}$. If a new inductance value differs from $L_{REF}$ by more than a predetermined value, one or more rotor turn shorts have occurred. Upon detection of the shorts, an alarm may be provided to operators to indicate that the generator should be rewound.

These and other objects, features, and advantages in accordance with the present invention are provided in one aspect by a system that comprises (a) an electrical tap for measuring a first voltage drop $V_{f1}$ and a subsequent voltage drop $V_{f2}$ across the field winding, (b) an electrical shunt for measuring a first current $I_{f1}$ and a subsequent current $I_{f2}$ entering the field winding; (c) an impedance-measuring circuit for determining a reference inductance $L_{REF}$ based on $V_{f1}$ and $I_{f1}$ and for determining a subsequent inductance L based on $V_{f2}$ and $I_{f2}$, (d) a memory circuit for storing $L_{REF}$, and (e) a data processing system for comparing $L_{REF}$ to the subsequent inductance L to determine whether $L_{REF}$ and the subsequent inductance L differ by more than a predetermined amount and for providing an alarm to indicate the presence of a shorted rotor turn when $L_{REF}$ and the subsequent inductance L differ by more than the predetermined amount.

In another aspect, the present invention is provided by a method comprising the steps of (a) determining a reference inductance $L_{REF}$ for the field winding at an initial time, (b) determining a second inductance L for the field winding at a time subsequent to the initial time, (c) comparing the reference inductance $L_{REF}$ to the second inductance L to determine whether the reference inductance $L_{REF}$ and the second inductance L differ by more than a predetermined amount, and (d) providing an alarm it the reference inductance $L_{REF}$ and the second inductance L differ by more than the predetermined amount.

BRIEF DESCRIPTION OF THE DRAWINGS

The invention is explained in more detail by way of example with reference to the following drawings.

DETAILED DESCRIPTION

An electrical generator requires a source of excitation current to energize its field winding. Excitation current is generally provided by an excitation system. Examples of excitations systems include static excitation systems and brushless excitation systems. Static and brushless excitation systems are described in detail below to provide an exemplary context for the invention. However, any other excitation system that provides an excitation power with an AC component is also suitable for use with the present invention.

Figure 1:
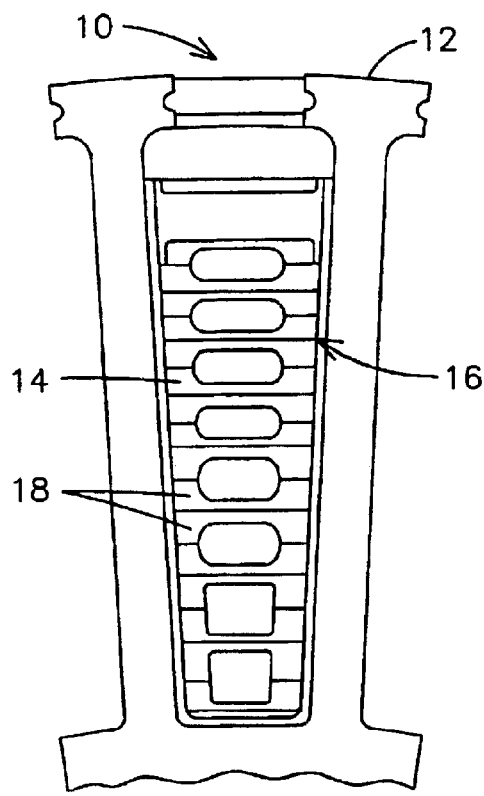
FIG. 1 illustrates a typical synchronous generator rotor slot.
Figure 2:
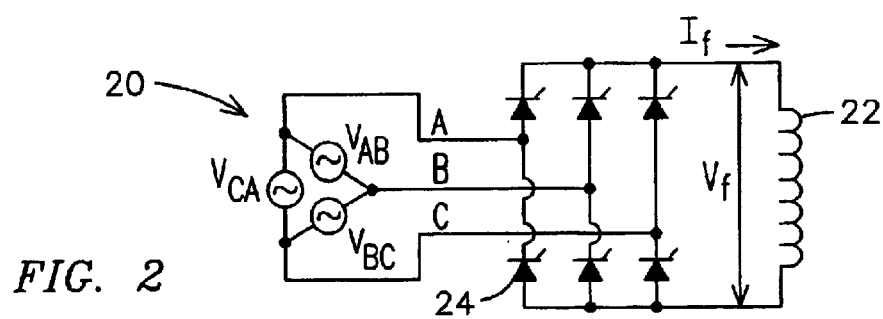
FIG. 2 illustrates a schematic of a static excitation system consistent with the present invention.

FIG. 2 illustrates a static excitation system 20 suitable for use with the present invention. The static excitation system 20 is provided with three-phase power (represented by $V_{AB}$, $V_{CA}$ and $V_{BC}$) from the main leads of a generator or from the station power. The three-phase power is fed to a voltage regulator 24, where it is rectified and regulated to produce an excitation current $I_f$. The excitation current $I_f$ is supplied to the field winding 22 of the generator and produces a voltage drop across the field winding 22 of $V_f$.

Figure 3:
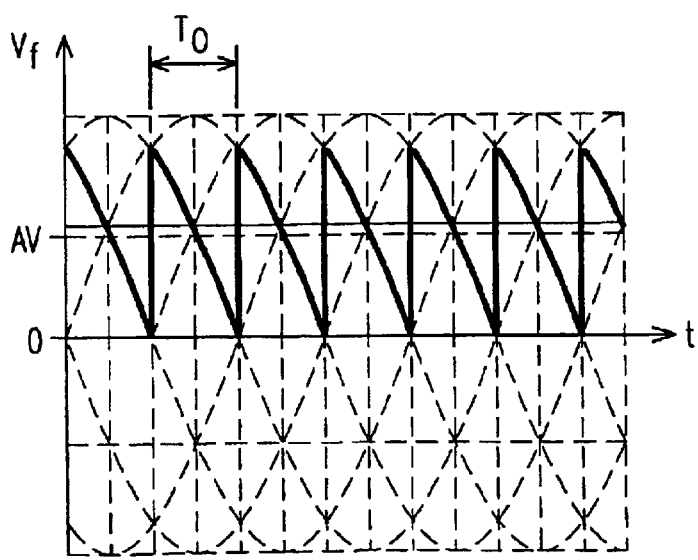
FIG. 3 illustrates a typical voltage waveform associated with the static excitation system of FIG. 2.

FIG. 3 illustrates the waveform representation of a typical voltage drop $V_f$ versus time for a field winding 22 in a generator with a static excitation system. $V_f$ includes a DC component, $V_{AV}$, and an AC (or periodic) component. The AC component of $V_f$ results from the rectification performed by the static excitation system. $V_f$ includes a number of harmonics. The first harmonic of $V_f$ is $V_0$. $V_0$ has a period $T_0$, which is related to an angular frequency $\omega_0$ by the formula $\omega_0 = 2\pi/T_0$. $V_f$ includes other harmonic voltages with periods $T_n$ such that $\omega_n = 2 T_n$.

Figure 4:
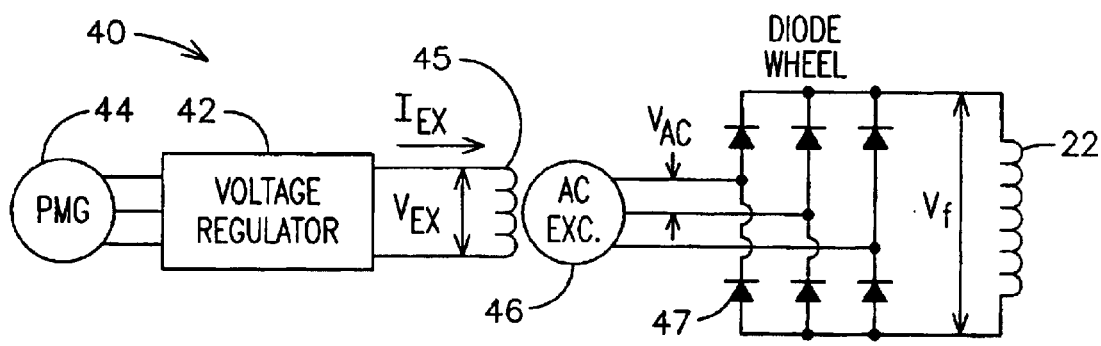
FIG. 4 illustrates a schematic of a brushless excitation system consistent with the present invention.

FIG. 4 illustrates a brushless excitation system 40 suitable for use with the present invention. The brushless excitation system 40 may include a permanent magnet generator (PMG) 44, which may be located on the outboard end of the excitation system 40. The permanent magnet generator 44 or other AC source provides AC power to a voltage regulator 42, which rectifies and regulates the power to produce an exciter current $I_{EX}$, which is fed to a stationary exciter field winding 45 to produce a voltage drop of VEX. The power provided to the stationary field winding 45 induces a three-phase voltage $V_{AC}$ in a rotating armature 46 located on the shaft of the excitation system 40. The three-phase voltage $V_{AC}$ is fed to a rotating rectifier 47, where it is rectified and regulated to produce an excitation current $I_f$. The excitation current $I_f$ is supplied to the field winding 22 of the generator and produces a voltage drop across the field winding 22 of $V_f$.

Figure 5:
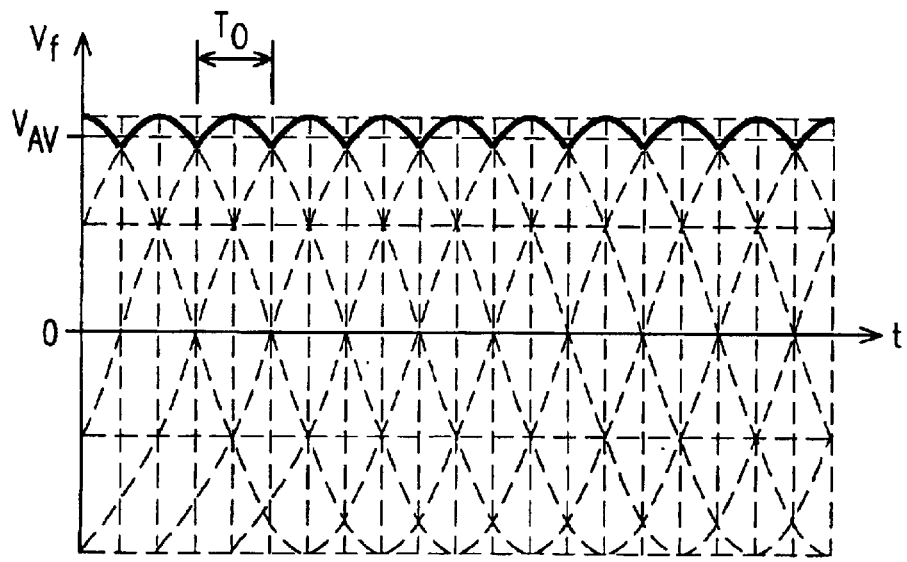
FIG. 5 illustrates a typical voltage waveform associated with the brushless excitation system of FIG. 4.

FIG. 5 illustrates the waveform representation of a typical voltage drop $V_f$ versus time for a field winding 22 in a generator with a brushless excitation system. $V_f$ includes a DC component, $V_{AV}$, and an AC component. The AC component of $V_f$, arises from the rectification of the rotating armature output. $V_f$, includes a number of harmonics. The first harmonic of $V_f$ is $V_0$. $V_0$ has a period $T_0$, which is related to an angular frequency $\omega_0$ of $V_f$ by the formula $\omega_0 = 2\pi/T_0$. $V_f$ may include other harmonics with periods $T_n$ such that $\omega_n = 2\pi/T_n$.

Methods and systems consistent with the present invention take advantage of the AC component (or periodic) of the excitation current 1 and the field winding voltage $V_f$ supplied by an excitation system in order to determine the inductance of a generator's field winding. The inductance L of a field winding is related to a generator's rotor turns by the formula $L = N^2 P$, where N is the number of turns in the filed winding and P is the permeance of the rotor flux path, which is generally a constant for a given set of operating conditions. Therefore, changes in the inductance L of the field winding are indicative of shorts between rotor turns. When one or more rotor turns short together, as occurs when an electrical generator ages and its insulation layers deteriorate, the number of turns N decreases. For example, if a rotor has 112 rotor turns, as with a 32-slot rotor with 7 conductors per slot, a single short would cause a decrease in the rotor inductance of about 2%. Two shorts, on the other hand, would decrease the inductance by 4%. After sufficient rotor turn shorts occur, a generator must generally be rewound to maintain a suitable efficiency and output capability.

Figure 6:
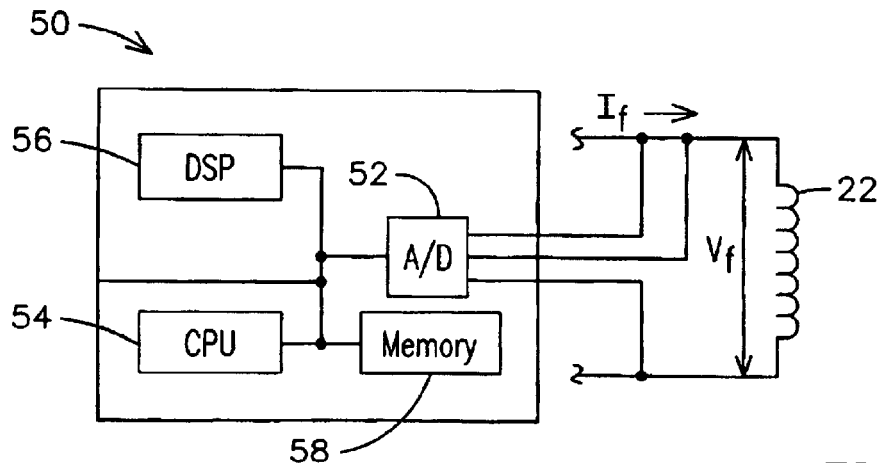
FIG. 6 illustrates an impedance-measurement circuit consistent with an exemplary embodiment of the present invention.

FIG. 6 illustrates an online impedance-measurement circuit 50 consistent with an exemplary embodiment of the present invention. Measurements of $I_f$ and $V_f$ are fed into the impedance-measurement circuit 50, for example, by communications cables or telemetry or any other available means of signal transfer. The measurement $V_f$ may be achieved, for example via one or more electrical taps across the field winding 22. The measurement of $I_f$ may be achieved, for example, via a current shunt that is inline with the field winding 22.

The impedance-measurement circuit 50 may be implemented as an analog or digital circuit. If digital circuitry is utilized, the impedance-measurement circuit 50 may include, for example, a digital-to-analog converter (A/D) 52 for converting the $I_f$ and $V_f$ into a digital format to facilitate analysis and calculations. In the exemplary embodiment illustrated in FIG. 6, the digital representation of $I_f$ and $V_f$ is fed to a digital signal processor (DSP) 56. The DSP 56 analyses the AC component of $I_f$ and $V_f$ to determine their fundamental frequency $\omega_0$ and the associated components $V_0$ and $I_0$ using well-known Fourier analysis techniques. Once the fundamental frequency $\omega_0$ has been determined, it is used by a calculation circuit 54, which may comprise for example a microprocessor or central processing unit, to calculate the inductance L of the field winding using the formula $L = V_o/(\omega_0 * I_o)$. A memory circuit 58 is provided to store at least one reference inductance $L_{REF}$. The reference inductance should be value representing the inductance of the field winding when field winding is known to be functioning properly, for example, when the generator is new or has recently been rewound. If the impedance-measurement circuit 50 is located on the spinning rotor of the generator, the results of the calculations performed by the impedance-measurement circuit 50 may be transmitted to a remote location for further processing via a wireless communications link.

Figure 7:
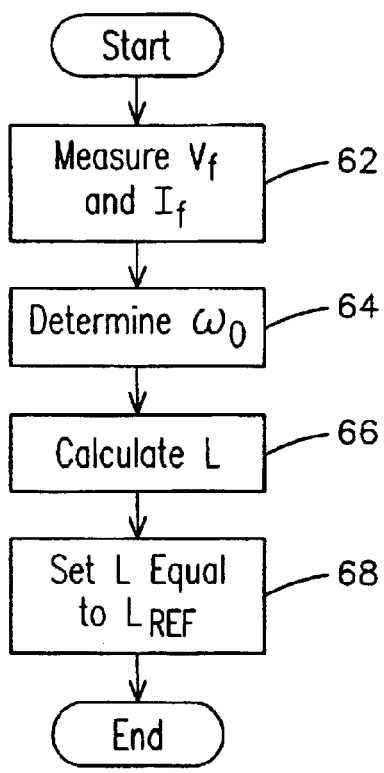
FIG. 7 illustrates steps associated with an exemplary method consistent with the present invention.
Figure 8:
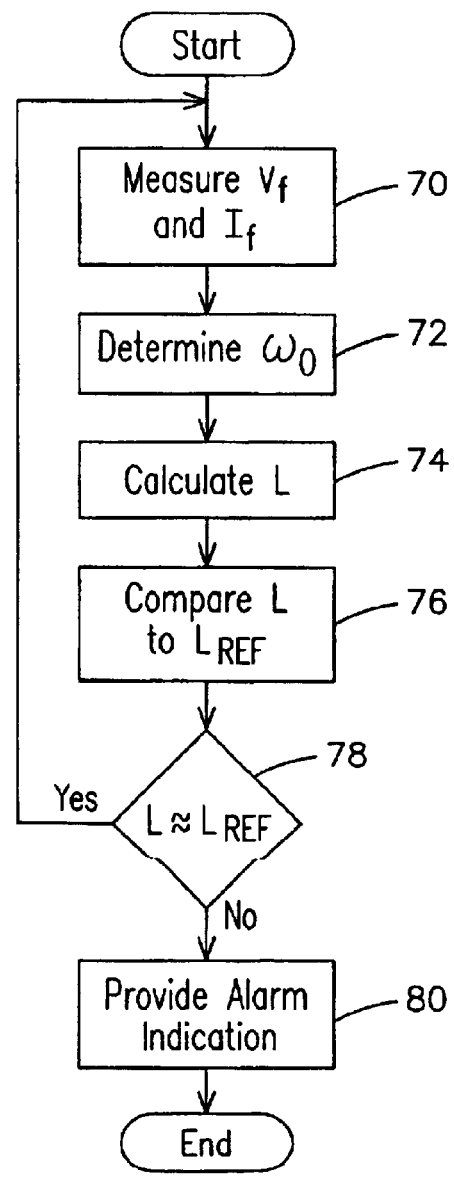
FIG. 8 illustrates steps associated with an exemplary method consistent with the present invention.

Referring now to FIGS. 7 and 8, a initial reference calculation phase of an exemplary method consistent with the present invention will now be described. As illustrated in FIG. 7, the exemplary method begins with the measurement of the field winding voltage drop $V_f$ and the field current $I_f$ (step 62). In a preferred embodiment, $V_f$ and $I_f$ are then sampled and converted to a digital format by an analog-to-digital converter (A/D) 52. The A/D 52 feeds a digital representation of $V_f$ and $I_f$ to a DSP circuit 56, which analyses $V_f$ and $I_f$ to determine a harmonic frequency $\omega_0$ and associated harmonic components $V_0$ and $I_0$ using Fourier analysis (step 64). These values are then used to calculate the inductance L of the field winding using the formula $L = V_o/(\omega_0 * I_o)$. An initial reference value of the inductance $L_{REF}$ should be calculated at a time when the field winding is known to be functioning properly, for example, when the generator is new or has recently been rewound. This reference inductance $L_{REF}$ may then be stored in memory for later calculations (step 68).

FIG. 8 illustrates the subsequent monitoring phase of the exemplary method. Over time, new measurements of $V_f$ and $I_f$ are taken at some predetermined interval of time (step 70). In the exemplary digital embodiment, the measurements are converted to a digital format by the A/D 52. The A/D 52 feeds the digital representation of $V_f$ and $I_f$ to the DSP 56, which analyses the signals to isolate a harmonic frequency $\omega_0$ and associated harmonic components $V_0$ and $I_0$ (step 72). These values are then used to calculate a subsequent value L of the inductance of the field winding (step 74). This subsequent inductance value L is then compared to the previously established $L_{REF}$ (step 76). If L is different from $L_{REF}$ by more than about 5%, for example, the change in L is indicative of one or more shorted rotor turns and an alarm is provided to operators (step 80). The alarm may signal to operators, for example, that the generator should be rewound. If L is within the acceptable range, steps 70 through 76 are repeated until a sufficient change in L is detected.

The present invention has been described with reference to the accompanying drawings that illustrate preferred embodiments of the invention. The invention may, however, be embodied in many different forms and should not be construed as limited to the embodiments set forth herein. For example, it will be understood that harmonics other than the fundamental may be used with methods and systems consistent with the present invention to determine inductance. In addition, inductance may be measured in other ways than described in the exemplary embodiment, such as by the use of bridges or by digital calculation of voltage and current phase relationships. The embodiments described above are provided so that this disclosure will be thorough and complete, and will fully convey the scope of the invention to those skilled in the art. The scope of the invention should be determined based upon the appended claims and their legal equivalents, rather than the specific embodiments described above.

What is claimed is:

1. A system for detecting one or more shorted rotor turns in a field winding of an electric generator, comprising:

an electrical tap for measuring a first voltage drop $V_{f1}$ and a subsequent voltage drop $V_{f2}$ across said field winding;

an electrical shunt for measuring a first current $I_{f1}$ and a subsequent current $I_{f2}$ entering said field winding;

an impedance-measuring circuit for determining a reference inductance $L_{REF}$ based on $V_{f1}$ and $I_{f1}$ and for determining a subsequent inductance L based on $V_{f2}$ and $I_{f2}$;

a memory circuit for storing $L_{REF}$; and a data processing system for comparing $L_{REF}$ to said subsequent inductance L to determine whether $L_{REF}$ and said subsequent inductance L differ by more than a predetermined amount and for providing an alarm to indicate the presence of said one or more shorted rotor turns when $L_{REF}$ and said subsequent inductance L differ by more than said predetermined amount.

2. The system of claim 1 wherein said impedance-measuring circuit comprises circuitry for isolating harmonic components $V_0$ and $I_0$ and an associated harmonic frequency $\omega_0$ using Fourier analysis and for determining $L_{REF}$ and L via a formula $L=V_o/(\omega_0*I_o)$.

3. The system of claim 1 wherein said impedance-measuring circuit comprises an inductance-measuring bridge.

4. The system of claim 1 wherein said impedance-measuring circuit is located onboard a spinning rotor of said electrical generator.

5. The system of claim 4 further including a telemetry circuit for transmitting data from said impedance-measuring circuit to a remote location.

6. A method for detecting one or more rotor turn shorts in a field winding of an electric generator, comprising the steps of:

taking a first measurement of a voltage $V_{f1}$ across said field winding;

taking a first measurement of a current $I_{f1}$ entering said field winding;

analyzing said first measurement $V_{f1}$ and $I_{f1}$ to isolate a harmonic component $V_{o1}$ of $V_{f1}$ and a harmonic component $I_{o1}$ of $I_{f1}$ and an associated harmonic frequency $\omega_{o1}$;

calculating a reference inductance $L_{REF}$ based on said first measurements;

taking a subsequent measurement of a voltage $V_{f2}$ across said field winding;

taking a subsequent measurement of a current $I_{f2}$ entering said field winding;

analyzing said subsequent measurement $V_{f2}$ and $I_{f2}$ to isolate a harmonic component $V_{o2}$ of $V_{f2}$ and a harmonic component $I_{o2}$ of $I_{f2}$ and an associated harmonic frequency $\omega_{o2}$;

calculating a subsequent inductance L based on said subsequent measurements;

comparing said reference inductance $L_{REF}$ to said subsequent inductance L to determine whether said reference inductance $L_{REF}$ and said subsequent inductance L differ by more than a predetermined amount; and providing an alarm indication if said reference inductance $L_{REF}$ and said subsequent inductance L differ by more than said predetermined amount.

7. The method of claim 6 wherein said predetermined amount is a difference between $L_{REF}$ and L of about 5%.

8. The method of claim 6 wherein said harmonic component is a fundamental harmonic component.

9. The method of claim 6 further comprising the step of transmitting said alarm via telemetry to a remote location.

10. The method of claim 6 wherein said step of calculating a reference inductance $L_{REF}$ and said step of calculating a subsequent inductance L comprises using a formula $L_{REF}=V_{o1}/(\omega_{o1}*I_{o1})$ and $L=V_{o2}/(\omega_{o2}*I_{o2})$, respectively.

11. A method of detecting a shorted rotor turn in a field winding of an electric generator, comprising the steps of:

determining a reference inductance $L_{REF}$ for said field winding at an initial time;

determining a second inductance L for said field winding at a time subsequent to said initial time;

comparing said reference inductance $L_{REF}$ to said second inductance L to determine whether said reference inductance $L_{REF}$ and said second inductance L differ by more than a predetermined amount; and providing an alarm if said reference inductance $L_{REF}$ and said second inductance L differ by more than said predetermined amount.

12. The method of claim 11 wherein said predetermined amount is a difference between $L_{REF}$ and L of about 5%.

13. The method of claim 11 further comprising the step of transmitting said alarm via telemetry to a remote location.

14. The method of claim 11 wherein said step of calculating a reference inductance $L_{REF}$ and said step of calculating a second inductance L includes isolating harmonic components $V_0$ and $I_0$ with a harmonic frequency $\omega_0$ and using the formula $L=V_o/(\omega_0*I_o)$.

15. The method of claim 14 wherein said harmonic component is a fundamental harmonic component.

16. The method of claim 11 wherein said step of calculating a reference inductance $L_{REF}$ and said step of calculating a second inductance L includes obtaining an indication of $L_{REF}$ and L from an inductance measurement bridge.

17. The method of claim 11 wherein said step of determining a reference inductance $L_{REF}$ and said step of determining a second inductance L comprises taking measurements from said field winding while said electrical generator is in operation.

* * * * *